United States Patent
Shan et al.

(10) Patent No.: US 10,269,282 B2
(45) Date of Patent: Apr. 23, 2019

(54) SHIFT REGISTER, GATE DRIVING CIRCUIT, DISPLAY PANEL AND DRIVING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Yue Shan, Beijing (CN); Jun Fan, Beijing (CN); Jiguo Wang, Beijing (CN); Yishan Fu, Beijing (CN); Mingchao Ma, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/759,722

(22) PCT Filed: Sep. 13, 2017

(86) PCT No.: PCT/CN2017/101554
§ 371 (c)(1),
(2) Date: Mar. 13, 2018

(87) PCT Pub. No.: WO2018/153063
PCT Pub. Date: Aug. 30, 2018

(65) Prior Publication Data
US 2018/0342187 A1 Nov. 29, 2018

(30) Foreign Application Priority Data
Feb. 23, 2017 (CN) .......................... 2017 1 0099908

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G11C 19/287* (2013.01); *G09G 2310/0286* (2013.01); *G09G 2310/06* (2013.01)

(58) Field of Classification Search
CPC . G09G 2310/0286; G09G 3/3266; G09G 3/20
See application file for complete search history.

(56) References Cited

U.S. PATENT DOCUMENTS

2006/0145999 A1   7/2006   Cho et al.
2014/0169518 A1*  6/2014   Kong ................... G09G 3/3674
                                                              377/64

FOREIGN PATENT DOCUMENTS

CN          1797509 A      7/2006
CN        101847445 A      9/2010
(Continued)

OTHER PUBLICATIONS

The International Search Report and Written Opinion dated Dec. 19, 2014; PCT/CN2017/101554.

*Primary Examiner* — Dennis P Joseph
(74) *Attorney, Agent, or Firm* — Ladas & Parry LLP

(57) ABSTRACT

A shift register, a gate driving circuit, a display panel and a driving method. The shift register includes: an input circuit, an output circuit, a pull-up-node pull-down circuit, a first control circuit, a second control circuit and an output pull-down circuit. The first control circuit is configured to write a fourth clock signal into a first pull-down node and write a first power voltage into a second pull-down node responsive to a first control signal, and to write the first power voltage into the first pull-down node responsive to a voltage of a pull-up node. The second control circuit is configured to (Continued)

write the fourth clock signal into the second pull-down node and write the first power voltage into the first pull-down node responsive to a second control signal, and to write the first power voltage into the second pull-down node responsive to the voltage of the pull-up node.

20 Claims, 5 Drawing Sheets

(56) References Cited

FOREIGN PATENT DOCUMENTS

| | | |
|---|---|---|
| CN | 103700333 A | 4/2014 |
| CN | 104252853 A | 12/2014 |
| CN | 104361852 A | 2/2015 |
| CN | 106782282 A | 5/2017 |
| KR | 20140095209 A | 8/2014 |

* cited by examiner

SHIFT REGISTER, GATE DRIVING CIRCUIT, DISPLAY PANEL AND DRIVING METHOD

TECHNICAL FIELD

Embodiments of the present disclosure relate to a shift register, a gate driving circuit, a display panel and a driving method.

BACKGROUND

With rapid development of display technologies, display panels are developed increasingly toward a trend of high integration and low cost. A gate-driver on array (GOA) technology uses a photolithography process to integrate a gate driving circuit directly onto an array substrate of a display device. A GOA circuit generally comprises a plurality of cascaded shift registers, and each shift register corresponds to a gate line in one row (for example, each shift register provides a scan driving signal for a gate line corresponding to a row of pixels), so as to implement scan driving on the display panel. This integration technology may save space of a bonding region and a fan-out region of a gate integrated circuit (IC), so as to achieve a narrow frame of the display panel, and meanwhile to reduce a product cost and improve a product yield.

Reliability of the GOA has a direct impact on reliability of the display panel; and therefore, how to improve the reliability of the GOA also becomes one focus of research.

SUMMARY

Embodiments of the disclosure provide a shift register, comprising: an input circuit, connected with a pull-up node, and configured to write a first clock signal into the pull-up node; an output circuit, connected with the pull-up ode and an output terminal respectively, and configured to write a second clock signal into the output terminal; a pull-up-node pull-down circuit, connected with the pull-up node, a first pull-down node, a second pull-down node and a first power terminal respectively; a first control circuit, configured to write a fourth clock signal into the first pull-down node and write a first power voltage into the second pull-down node in response to a first control signal, and to write the first power voltage into the first pull-down node in response to a voltage of the pull-up node; a second control circuit, configured to write the fourth clock signal into the second pull-down node and write the first power voltage into the first pull-down node in response to a second control signal, and to write the first power voltage into the second pull-down node in response to the voltage of the pull-up node; and an output pull-down circuit, connected with the output terminal, the first pull-down node, the second pull-down node, and the first power terminal respectively. The first control signal and the second control signal are mutually reverse signals.

For example, the shift register provided by embodiments of the disclosure further includes a reset circuit, connected with the pull-up node, and configured to write a third clock signal into the pull-up node. The input circuit includes a first transistor, a first electrode of the first transistor is connected with a first clock signal terminal to receive the first clock signal, a gate electrode of the first transistor is connected with the input terminal to receive an input signal, and a second electrode of the first transistor is connected with the pull-up node; the output circuit includes a second transistor, a first electrode of the second transistor is connected with a second clock signal terminal to receive the second clock signal, a gate electrode of the second transistor is connected with the pull-up node, and a second electrode of the second transistor is connected with the output terminal; the reset circuit includes a third transistor, a first electrode of the third transistor is connected with a third clock signal terminal to receive the third clock signal, a gate electrode of the third transistor is connected with a reset signal terminal to receive a reset signal, and a second electrode of the third transistor is connected with the pull-up node.

In the shift register provided by embodiments of the disclosure, the pull-up-node pull-down circuit includes a fourth transistor and a fifth transistor; a first electrode of the fourth transistor is connected with the pull-up node, a gate electrode of the fourth transistor is connected with the second pull-down node, and a second electrode of the fourth transistor is connected with the first power terminal to receive the first power voltage; a first electrode of the fifth transistor is connected with the pull-up node, a gate electrode of the fifth transistor is connected with the first pull-down node, and a second electrode of the fifth transistor is connected with the first power terminal to receive the first power voltage.

In the shift register provided by embodiments of the disclosure, the fourth transistor and the fifth transistor operate alternately under control of the first control circuit and the second control circuit.

In the shift register provided by embodiments of the disclosure, the first control circuit includes a sixth transistor, a seventh transistor and an eighth transistor; a first electrode of the sixth transistor is connected with the second pull-down node, a gate electrode of the sixth transistor is connected with the first control-signal terminal to receive the first control signal, a second electrode of the sixth transistor is connected with the first power terminal to receive the first power voltage; a first electrode of the seventh transistor is connected with the first pull-down node, a gate electrode of the seventh transistor is connected with the pull-up node, and a second electrode of the seventh transistor is connected with the first power terminal to receive the first power voltage; a first electrode of the eighth transistor is configured to receive the fourth clock signal, a gate electrode of the eighth transistor is connected with the first control-signal terminal to receive the first control signal, and a second electrode of the eighth transistor is connected with the first pull-down node; the second control circuit includes a ninth transistor, a tenth transistor and an eleventh transistor; a first electrode of the ninth transistor is connected with the first pull-down node, a gate electrode of the ninth transistor is connected with the second control-signal terminal to receive the second control signal, and a second electrode of the ninth transistor is connected with the first power terminal to receive the first power voltage; a first electrode of the tenth transistor is connected with the second pull-down node, a gate electrode of the tenth transistor is connected with the pull-up node, and a second electrode of the tenth transistor is connected with the first power terminal to receive the first power voltage; a first electrode of the eleventh transistor is configured to receive the fourth clock signal, a gate electrode of the eleventh transistor is connected with the second control-signal terminal to receive the second control signal, and a second electrode of the eleventh transistor is connected with the second pull-down node.

In the shift register provided by embodiments of the disclosure, the output pull-down circuit includes a twelfth transistor and a thirteenth transistor; a first electrode of the twelfth transistor is connected with the output terminal, a gate electrode of the twelfth transistor is connected with the first pull-down node, and a second electrode of the twelfth transistor is connected with the first power terminal to receive the first power voltage; a first electrode of the thirteenth transistor is connected with the output terminal, a gate electrode of the thirteenth transistor is connected with the second pull-down node, and a second electrode of the thirteenth transistor is connected with the first power terminal to receive the first power voltage.

In the shift register provided by embodiments of the disclosure, the twelfth transistor and the thirteenth transistor operate alternately under control of the first control circuit and the second control circuit.

For example, the shift register provided by embodiments of the disclosure further includes a first storage circuit, connected with the pull-up node and the output terminal respectively, wherein the first storage circuit includes a first capacitor, a first terminal of the first capacitor is connected with the pull-up node, and a second terminal of the first capacitor is connected with the output terminal.

For example, the shift register provided by embodiments of the disclosure further includes a discharging circuit, connected with a discharging signal terminal, the output terminal, the first pull-down node, the second pull-down node and the first power terminal respectively, and is configured to, when an abnormal power-down occurs, write the discharging signal into the output terminal, and write the first power voltage into the first pull-down node and the second pull-down node respectively.

In the shift register provided by embodiments of the disclosure, the discharging circuit includes a fourteenth transistor, a fifteenth transistor and a sixteenth transistor; a first electrode of the fourteenth transistor is connected with the discharging signal terminal to receive the discharging signal, a gate electrode of the fourteenth transistor is connected with the discharging signal terminal to receive the discharging signal, and a second electrode of the fourteenth transistor is connected with the output terminal; a first electrode of the fifteenth transistor is connected with the second pull-down node, a gate electrode of the fifteenth transistor is connected with the discharging signal terminal to receive the discharging signal, and a second electrode of the fifteenth transistor is connected with the first power terminal; a first electrode of the sixteenth transistor is connected with the first pull-down node, a gate electrode of the sixteenth transistor is connected with the discharging signal terminal to receive the discharging signal, and a second electrode of the sixteenth transistor is connected with the first power terminal.

For example, the shift register provided by embodiments of the disclosure further includes a second storage circuit and a third storage circuit. The second storage circuit is connected with the first pull-down node and the first power terminal respectively, and is configured to maintain a voltage difference between the first pull-down node and the first power terminal; the third storage circuit is connected with the second pull-down node and the first power terminal respectively, and is configured to maintain a voltage difference between the second pull-down node and the first power terminal.

In the shift register provided by embodiments of the disclosure, the second storage circuit includes a second capacitor, a first terminal of the second capacitor is connected with the first pull-down node, and a second terminal of the second capacitor is connected with the first power terminal; the third storage circuit includes a third capacitor, a first terminal of the third capacitor is connected with the second pull-down node, and a second terminal of the third capacitor is connected with the first power terminal.

For example, the shift register provided by embodiments of the disclosure further includes a seventeenth transistor, wherein the first control circuit and the second control circuit receive the fourth clock signal through the seventeenth transistor, a first electrode of the seventeenth transistor is connected with the fourth clock signal terminal, a gate electrode of the seventeenth transistor is connected with the fourth clock signal terminal, and a second electrode of the seventeenth transistor is connected with the first control circuit and the second control circuit.

Embodiments of the disclosure also provide a gate driving circuit, comprising the shift register provided by any embodiment of the disclosure.

For example, the gate driving circuit provided by embodiments of the disclosure further includes a plurality of cascaded shift registers, wherein except a shift register at a first stage and a shift register at a last stage, an input terminal of a shift register at a present stage is connected with an output terminal of a shift register at a previous stage; and a reset signal terminal of the shift register at a present stage is connected with an output terminal of a shift register at a next stage.

Embodiments of the disclosure also provide a display panel, comprising the gate driving circuit provided by any embodiment of the disclosure.

Embodiments of the disclosure also provide a driving method of the shift register provided by any embodiment of the disclosure, comprising: within a display time of one frame, setting a first control signal to a high-level voltage, and setting a second control signal to a low-level voltage, wherein when the first control signal is the high-level voltage, a fourth clock signal is written into a first pull-down node, a first power voltage is written into a second pull-down node, and in response to a voltage of a pull-up node being the high-level voltage, the first power voltage is written into the first pull-down node; within a display time of at least another frame, setting the second control signal to the high-level voltage, and setting the first control signal to the low-level voltage, wherein when the second control signal is the high-level voltage, the fourth clock signal is written into the second pull-down node, the first power voltage is written into the first pull-down node, and in response to the voltage of the pull-up node being the high-level voltage, the first power voltage is written into the second pull-down node.

BRIEF DESCRIPTION OF THE DRAWINGS

In order to illustrate the technical solutions in the embodiments of the present disclosure more clearly, the drawings needed to be used in the description of the embodiments or the existing arts will be briefly described in the following; it is obvious that the drawings described below are only related to some embodiments of the present disclosure, and are not intended to be limitative to the disclosure.

DETAILED DESCRIPTION

Figure 1:
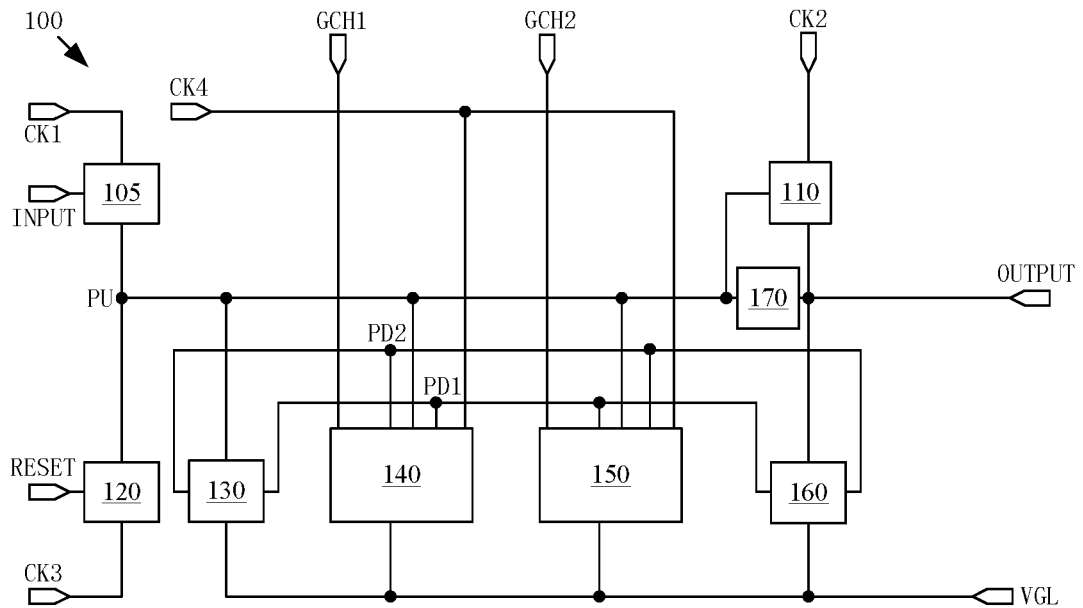
FIG. 1 is a first schematic diagram of a shift register provided by an embodiment of the present disclosure.

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies are not described in the present disclosure so as not to obscure the exemplary embodiments of the present disclosure. Examples given are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. In addition, in respective embodiments of the present disclosure, same or similar reference signs denote same or similar parts.

A shift register, a gate driving circuit, a display panel and a driving method provided by embodiments of the present disclosure may enhance anti-interference capability and improve reliability of the gate driving circuit and the display panel.

An embodiment of the present disclosure provides a shift register 100. As shown in FIG. 1, the shift register 100 comprises an input circuit 105, an output circuit 110, a reset circuit 120, a pull-up-node pull-down circuit 130, a first control circuit 140, a second control circuit 150, an output pull-down circuit 160 and a first storage circuit 170.

For example, the input circuit 105 is connected with a pull-up node PU, and is configured to write a first clock signal CK1 into the pull-up node PU; the output circuit 110 is respectively connected with the pull-up node PU and an output terminal OUTPUT, and is configured to write a second clock signal CK2 into the output terminal OUTPUT; the reset circuit 120 is connected with the pull-up node PU, and is configured to write a third clock signal CK3 into the pull-up node PU; the pull-up-node pull-down circuit 130 is respectively connected with the pull-up node PU, a first pull-down node PD1, a second pull-down node PD2 and a first power terminal (for example, the first power terminal is used for providing a first power voltage VGL); the first control circuit 140 is respectively connected with the pull-up node PU, the first pull-down node PD1, the second pull-down node PD2, a first control-signal terminal (for providing a first control signal GCH1), a first power terminal (for providing the first power voltage VGL) and a fourth clock signal terminal (for providing a fourth clock signal CK4), and the first control circuit 140 is configured to write the fourth clock signal CK4 into the first pull-down node PD1 and write the first power voltage VGL into the second pull-down node PD2 in response to the first control signal GCH1, and to write the first power voltage VGL into the first pull-down node PD1 in response to a voltage of the pull-up node PU; the second control circuit 150 is respectively connected with the pull-up node PU, the first pull-down node PD1, the second pull-down node PD2, a second control-signal terminal (for providing a second control signal GCH2), the first power terminal (for providing the first power voltage VGL) and the fourth clock signal terminal (for providing the fourth clock signal CK4), and the second control circuit 150 is configured to write the fourth clock signal CK4 into the second pull-down node PD2 and write the first power voltage VGL into the first pull-down node PD1 in response to the second control signal GCH2, and to write the first power voltage VGL into the second pull-down node PD2 in response to the voltage of the pull-up node PU; the output pull-down circuit 160 is respectively connected with the output terminal OUTPUT, the first pull-down node PD1, the second pull-down node PD2 and the first power terminal (for providing the first power voltage VGL); and the first storage circuit 170 is respectively connected with the pull-up node PU and the output terminal OUTPUT.

For example, the first control signal GCH1 and the second control signal GCH2 are mutually reverse signals. The mutually reverse signals refer to that when the first control signal GCH1 is at a high voltage level (for example, 5V, 10V or other voltage level values), the second control signal GCH2 is at a low voltage level (for example, 0V, 1V, −5V, −10V or other voltage level values); when the first control signal GCH1 is at a low voltage level (for example, 0V, 1V, −5V, −10V or other voltage level values), the second control signal GCH2 is at a high voltage level (for example, 5V, 10V or other voltage level values). It is worth noting that, the high voltage level is referred to as being relative to the low voltage level, and a value of the high voltage level is greater than a value of the low voltage level. In different implementation ways, values of the high voltage level may be different, and values of the low voltage level may also be different. For another example, the input circuit 105 is connected with the pull-up node PU, and is configured to write the first clock signal into the pull-up node when the input circuit 105 is turned on; the output circuit 110 is respectively connected with the pull-up node PU and the output terminal OUTPUT, and is configured to write the second clock signal into the output terminal when the output circuit 110 is turned on; the reset circuit 120 is connected with the pull-up node PU, and is configured to write the third clock signal into the pull-up node when the reset circuit 120 is turned on; and the pull-up-node pull-down circuit 130 is respectively connected with the pull-up node, the first pull-down node, the second pull-down node and the first power terminal. The first control circuit 140 is configured to: write the fourth clock signal into the first pull-down node and write the first power voltage into the second pull-down node in response to the first control signal being at a high voltage level, when the first control circuit 140 is turned on; and write the first power voltage into the first pull-down node, in response to the voltage of the pull-up node being a high voltage. The second control circuit 150 is configured to: write the fourth clock signal into the second pull-down node and write the first power voltage into the first pull-down node in response to the second control signal being a high-level voltage, when the second control circuit 150 is turned on; and to write the first power voltage into the second pull-down node in response to the voltage of the pull-up node being a high-level voltage.

Figure 2:
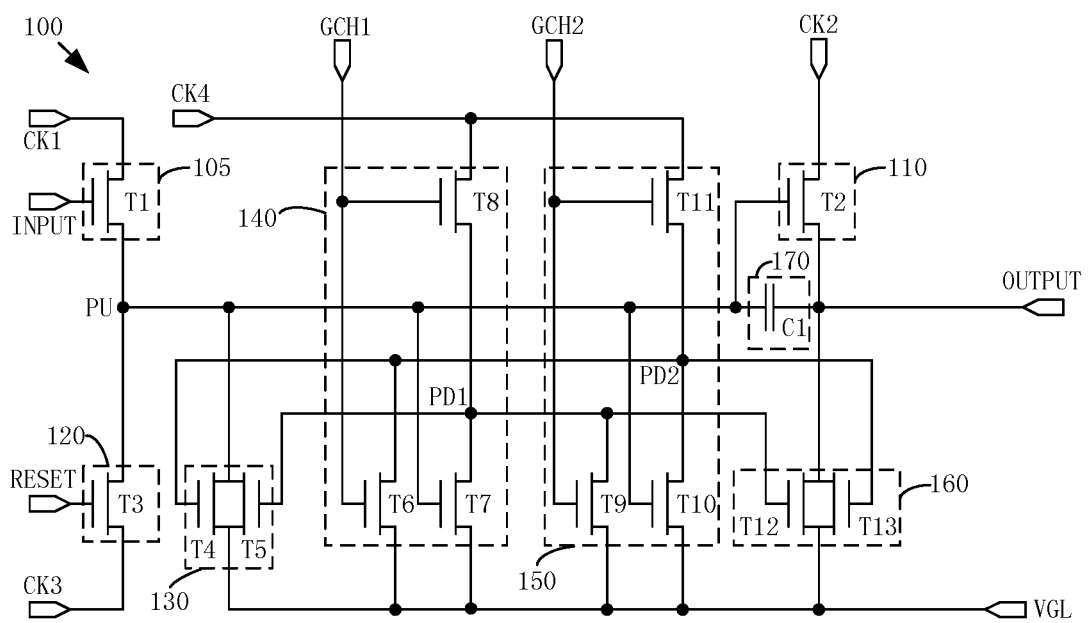
FIG. 2 is a second schematic diagram of a shift register provided by an embodiment of the present disclosure.

For example, with reference to FIG. 2, in the shift register 100 provided by an embodiment of the present disclosure, the input circuit 105 includes a first transistor T1. A first electrode of the first transistor T1 is connected with a first clock signal terminal to receive the first clock signal CK1, a gate electrode of the first transistor T1 is connected with the input terminal to receive an input signal INPUT, and a second electrode of the first transistor T1 is connected with the pull-up node PU.

For example, with reference to FIG. 2, the output circuit 110 includes a second transistor T2. A first electrode of the second transistor T2 is connected with a second clock signal terminal to receive the second clock signal CK2, a gate electrode of the second transistor T2 is connected with the pull-up node PU, and a second electrode of the second transistor T2 is connected with the output terminal OUTPUT.

For example, with reference to FIG. 2, the reset circuit 120 includes a third transistor T3. A first electrode of the third transistor T3 is connected with a third clock signal terminal to receive the third clock signal CK3, a gate electrode of the third transistor T3 is connected with the reset signal terminal to receive a reset signal RESET, and a second electrode of the third transistor T3 is connected with the pull-up node PU.

For example, with reference to FIG. 2, in the shift register 100 provided by an embodiment of the present disclosure, the pull-up-node pull-down circuit 130 includes a fourth transistor T4 and a fifth transistor T5. A first electrode of the fourth transistor T4 is connected with the pull-up node PU, a gate electrode of the fourth transistor T4 is connected with the second pull-down node PD2, and a second electrode of the fourth transistor T4 is connected with the first power terminal to receive the first power voltage VGL. A first electrode of the fifth transistor T5 is connected with the pull-up node PU, a gate electrode of the fifth transistor T5 is connected with the first pull-down node PD1, and a second electrode of the fifth transistor T5 is connected with the first power terminal to receive the first power voltage VGL.

For example, with reference to FIG. 2, in the shift register 100 provided by an embodiment of the present disclosure, the first control circuit 140 includes a sixth transistor T6, a seventh transistor T7 and an eighth transistor T8. A first electrode of the sixth transistor T6 is connected with the second pull-down node PD2, a gate electrode of the sixth transistor T6 is connected with the first control-signal terminal to receive the first control signal GCH1, a second electrode of the sixth transistor T6 is connected with the first power terminal to receive the first power voltage VGL. A first electrode of the seventh transistor T7 is connected with the first pull-down node PD1, a gate electrode of the seventh transistor T7 is connected with the pull-up node PU, and a second electrode of the seventh transistor T7 is connected with the first power terminal to receive the first power voltage VGL. A first electrode of the eighth transistor T8 is configured to receive the fourth clock signal CK4, a gate electrode of the eighth transistor T8 is connected with the first control-signal terminal to receive the first control signal GCH1, and a second electrode of the eighth transistor T8 is connected with the first pull-down node PD1.

For example, with reference to FIG. 2, in the shift register 100 provided by an embodiment of the present disclosure, the second control circuit 150 includes a ninth transistor T9, a tenth transistor T10 and an eleventh transistor T11. A first electrode of the ninth transistor T9 is connected with the first pull-down node PD1, a gate electrode of the ninth transistor T9 is connected with the second control-signal terminal to receive the second control signal GCH2, and a second electrode of the ninth transistor T9 is connected with the first power terminal to receive the first power voltage VGL. A first electrode of the tenth transistor T10 is connected with the second pull-down node PD2, a gate electrode of the tenth transistor T10 is connected with the pull-up node PU, and a second electrode of the tenth transistor T10 is connected with the first power terminal to receive the first power voltage VGL. A first electrode of the eleventh transistor T11 is configured to receive the fourth clock signal CK4, a gate electrode of the eleventh transistor T11 is connected with the second control-signal terminal to receive the second control signal GCH2, and a second electrode of the eleventh transistor T11 is connected with the second pull-down node PD2.

For example, with reference to FIG. 2, in the shift register 100 provided by an embodiment of the present disclosure, the output pull-down circuit 160 includes a twelfth transistor T12 and a thirteenth transistor T13. A first electrode of the twelfth transistor T12 is connected with the output terminal OUTPUT, a gate electrode of the twelfth transistor T12 is connected with the first pull-down node PD1, and a second electrode of the twelfth transistor T12 is connected with the first power terminal to receive the first power voltage VGL. A first electrode of the thirteenth transistor T13 is connected with the output terminal OUTPUT, a gate electrode of the thirteenth transistor T13 is connected with the second pull-down node PD2, and a second electrode of the thirteenth transistor T13 is connected with the first power terminal to receive the first power voltage VGL.

For example, with reference to FIG. 2, in the shift register 100 provided by an embodiment of the present disclosure, the first storage circuit 170 includes a first capacitor C1. A first terminal of the first capacitor C1 is connected with the pull-up node PU, and a second terminal of the first capacitor C1 is connected with the output terminal OUTPUT.

For example, the first power voltage VGL is a low-level voltage (for example, 0V, −5V, or other values).

Figure 3:
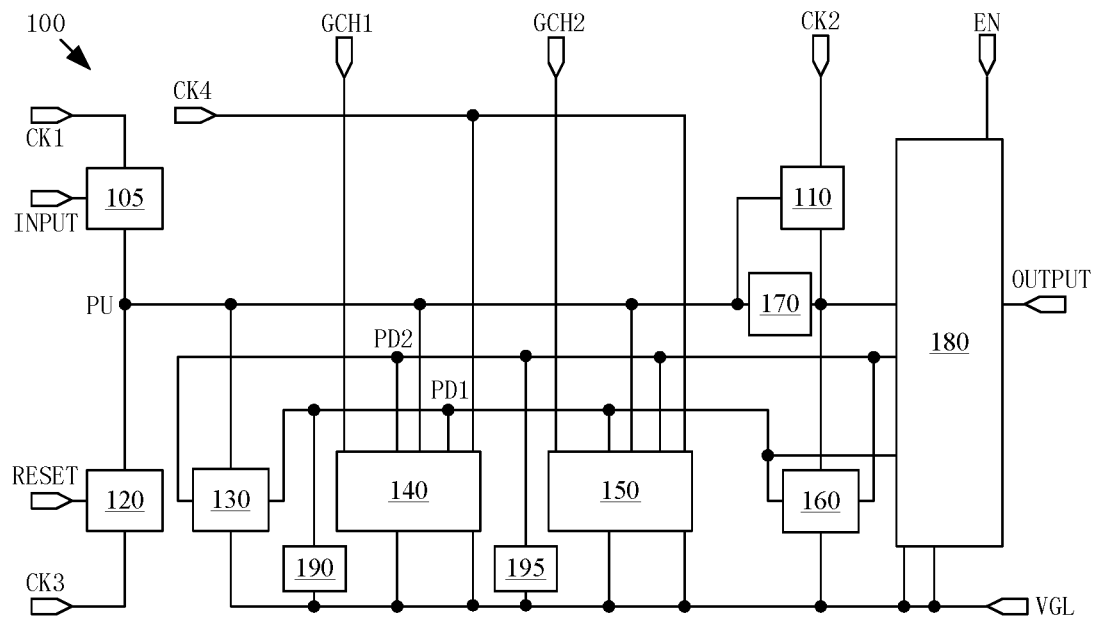
FIG. 3 is a third schematic diagram of a shift register provided by an embodiment of the present disclosure.
Figure 4:
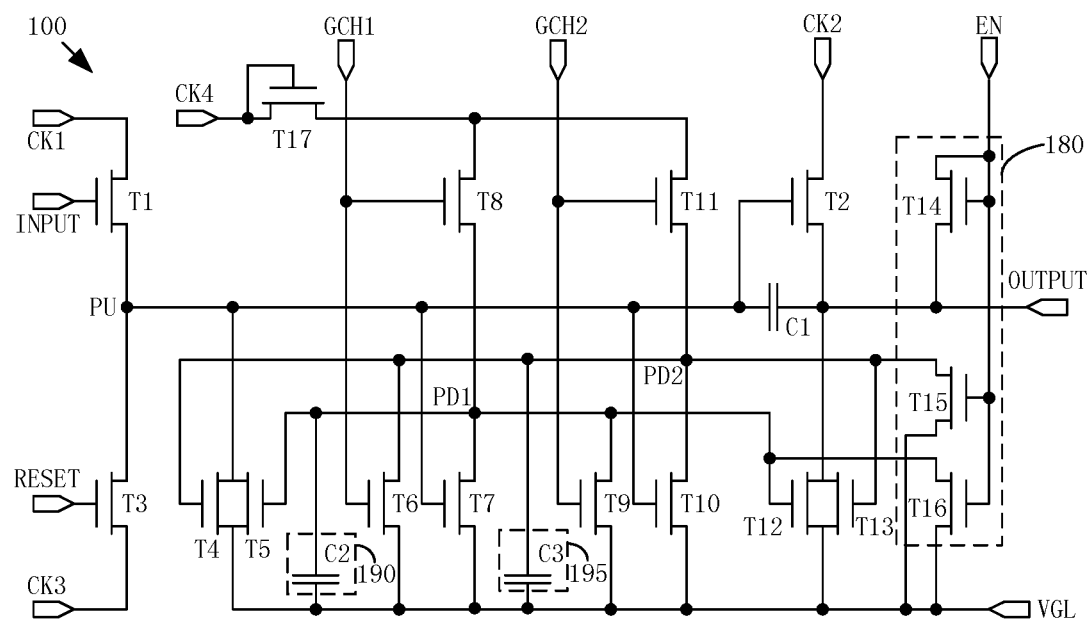
FIG. 4 is a fourth schematic diagram of a shift register provided by an embodiment of the present disclosure.

For example, with reference to FIG. 3 and FIG. 4, the shift register 100 provided by an embodiment of the present disclosure further comprises a discharging circuit 180. The discharging circuit 180 is respectively connected with a discharging signal terminal (for providing a discharging signal EN), the output terminal OUTPUT, the first pull-down node PD1, the second pull-down node PD2 and the first power terminal (for providing the first power voltage VGL). The discharging circuit 180 is configured to, when abnormal power-down occurs, write the discharging signal EN into the output terminal OUTPUT and write the first power voltage VGL into the first pull-down node PD1 and the second pull-down node PD2 respectively.

For example, with reference to FIG. 4, in the shift register 100 provided by an embodiment of the present disclosure, the discharging circuit 180 includes a fourteenth transistor T14, a fifteenth transistor T15 and a sixteenth transistor T16. A first electrode of the fourteenth transistor T14 is connected with the discharging signal terminal to receive the discharging signal EN, a gate electrode of the fourteenth transistor T14 is connected with the discharging signal terminal to receive the discharging signal EN, and a second electrode of the fourteenth transistor T14 is connected with the output terminal OUTPUT. A first electrode of the fifteenth transistor T15 is connected with the second pull-down node PD2, a gate electrode of the fifteenth transistor T15 is connected with the discharging signal terminal to receive the discharging signal EN, and a second electrode of the fifteenth transistor T15 is connected with the first power terminal. A first electrode of the sixteenth transistor T16 is connected with the first pull-down node PD1, a gate electrode of the sixteenth transistor T16 is connected with the discharging signal terminal to receive the discharging signal EN, and a second electrode of the sixteenth transistor T16 is connected with the first power terminal.

For example, the discharging circuit 180 may be configured to perform discharging on the shift register when abnormal power-down occurs in the circuit, so as to prevent the circuit from being damaged.

For example, with reference to FIG. 3 and FIG. 4, the shift register 100 provided by an embodiment of the present disclosure further comprises a second storage circuit 190 and a third storage circuit 195. The second storage circuit 190 is respectively connected with the first pull-down node PD1 and the first power terminal, and the second storage circuit 190 is configured to maintain voltage difference between the first pull-down node PD1 and the first power terminal. The third storage circuit 195 is respectively connected with the second pull-down node PD2 and the first power terminal, and the third storage circuit 195 is configured to maintain voltage difference between the second pull-down node PD2 and the first power terminal.

For example, with reference to FIG. 4, in the shift register 100 provided by an embodiment of the present disclosure, the second storage circuit 190 includes a second capacitor C2. A first terminal of the second capacitor C2 is connected with the first pull-down node PD1, and a second terminal of the second capacitor C2 is connected with the first power terminal. The third storage circuit 195 includes a third capacitor C3, a first terminal of the third capacitor C3 is connected with the second pull-down node PD2, and a second terminal of the third capacitor C3 is connected with the first power terminal.

For example, by providing the second storage circuit 190, it is possible to improve stability of a voltage of the first pull-down node PD1, prevent the voltage of the first pull-down node PD1 from being abruptly changed, and further improve stability of the shift register.

For example, by providing the third storage circuit 195, it is possible to improve stability of a voltage of the second pull-down node PD2, prevent the voltage of the second pull-down node PD2 from being abruptly changed, and further improve stability of the shift register.

For example, with reference to FIG. 4, the shift register 100 provided by an embodiment of the present disclosure further comprises a seventeenth transistor T17. The first control circuit 140 (for example, the eighth transistor T8 in the first control circuit 140) and the second control circuit 150 (for example, the eleventh transistor T11 in the second control circuit 150) receive the fourth clock signal CK4 through the seventeenth transistor T17. A first electrode of the seventeenth transistor T17 is connected with the fourth clock signal terminal, a gate electrode of the seventeenth transistor T17 is connected with the fourth clock signal terminal, and a second electrode of the seventeenth transistor T17 is connected with the first control circuit 140 (for example, the eighth transistor T8 in the first control circuit 140) and the second control circuit 150 (for example, the eleventh transistor T11 in the second control circuit 150).

For example, by providing the seventeenth transistor T17, it is possible to prevent current from flowing backwardly when the circuit is abnormal, and to improve stability of the shift register.

It should be noted that, all the transistors used in the embodiments of the present disclosure may be thin film transistors, or field effect transistors, or other switching devices with same characteristics. A source electrode and a drain electrode of a transistor used herein may be structurally symmetrical, and so the source electrode and the drain electrode thereof may be structurally indistinguishable. In the embodiments of the present disclosure, in order to distinguish the two electrodes of the transistor beside the gate electrode, it is directly described that one of the two electrodes is a first electrode, and the other electrode is a second electrode. The first electrodes and the second electrodes of all or part of the transistors in the embodiments of the present disclosure are interchangeable according to needs. For example, the first electrode of the transistor according to the embodiments of the present disclosure may be the source electrode, and the second electrode may be the drain electrode; alternatively, the first electrode of the transistor is the drain electrode and the second electrode is the source electrode. In addition, the transistors may be classified into N-type and P-type transistors according to the characteristics of the transistors. When a transistor is a P-type transistor, a turn-on voltage is a low-level voltage (for example, 0V, −5V or other values) and a turn-off voltage is a high-level voltage (for example, 5V, 10V or other values); when the transistor is an N-type transistor, the turn-on voltage is a high-level voltage (for example, 5V, 10V, or other values) and the turn-off voltage is a low-level voltage (for example, 0V, −5V, or other values). In the embodiments of the present disclosure, it will be illustrated by taking a case where the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, the eleventh transistor T11, the twelfth transistor T12, the thirteenth transistor T13, the fourteenth transistor T14, the fifteenth transistor T15, the sixteenth transistor T16 and the seventeenth transistor T17 are all N-type transistors as an example. Based on description and teaching of the implementations in the present disclosure, those with ordinary skills in the art can easily conceive of the implementations of the P-type transistors or combination of the N-type and the P-type transistors used in the embodiments of the present disclosure without any inventive effort. Therefore, these implementations are also within the protection scope of the present disclosure.

Figure 5:
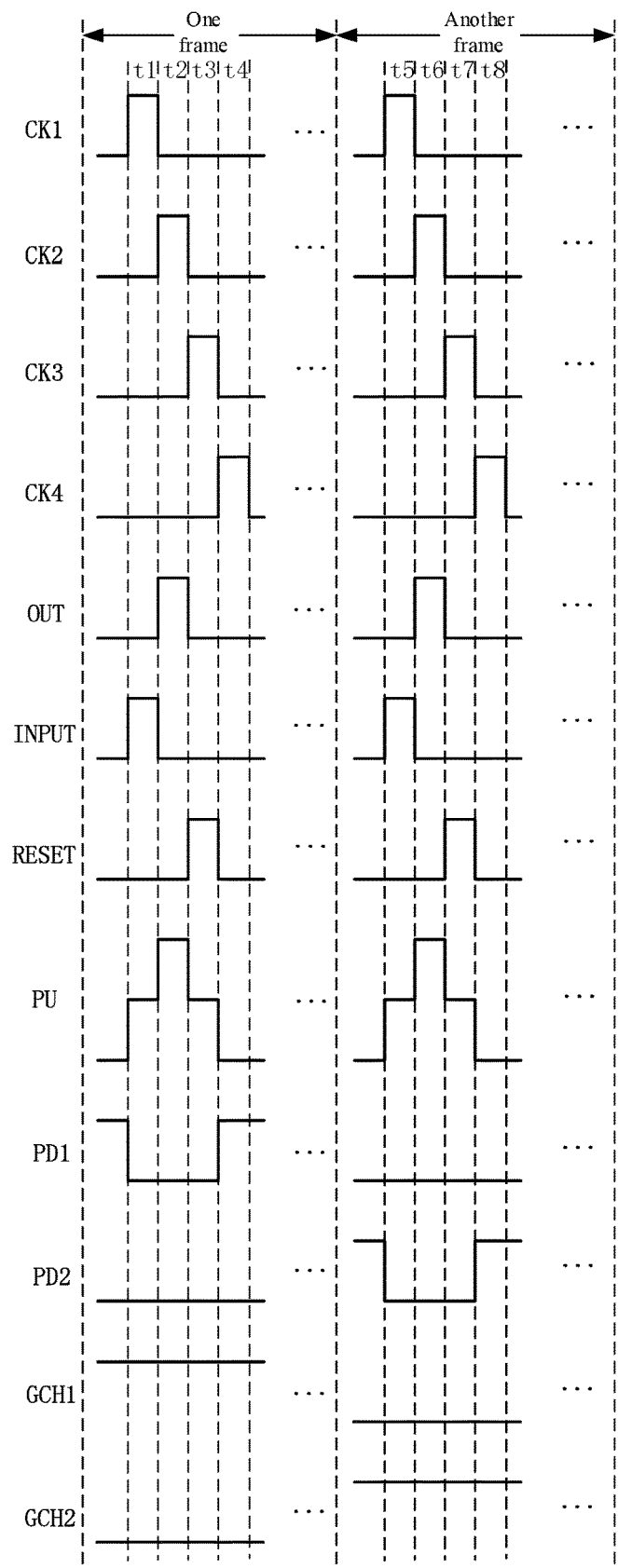
FIG. 5 is a driving timing diagram of a shift register provided by an embodiment of the present disclosure.

For example, FIG. 5 is a driving timing diagram of the shift register 100 provided by an embodiment of the present disclosure. In the following, an operation principle of the shift register provided by an embodiment of the present disclosure is introduced by taking the shift register shown in FIG. 4 and the driving timing shown in FIG. 5 as an example. For example, the shift register 100 provided by an embodiment of the present disclosure may implement forward scanning and backward scanning; that is to say, functions of the input circuit 105 and the reset circuit 120 may be exchanged, and hereinafter it is illustrated with the forward scanning as an example.

For example, as shown in FIG. 5, within a display time of one frame (including a first stage t1, a second stage t2, a third stage t3 and a fourth stage t4), a first control signal GCH1 is a high-level voltage (for example, 5V, 10V or other values), and the second control signal GCH2 is a low-level voltage (for example, 0V, −5V or other values). Since the first control signal GCH1 is a high-level voltage, the sixth transistor T6 and the eighth transistor T8 are turned on; the second control signal GCH2 is a low-level voltage, and the ninth transistor T9 and the eleventh transistor T11 are turned off. Since the sixth transistor T6 connects the first power terminal (providing the first power voltage VGL) with the second pull-down node PD2, the second pull-down node PD2 has the low-level voltage within the display time of the one frame.

Within a display time of another frame (including a fifth stage t5, a sixth stage t6, a seventh stage t7 and an eighth stage t8), the first control signal GCH1 is a low-level voltage (for example, 0V, −5V or other values), and the second control signal GCH2 is a high-level voltage (for example, 5V, 10V or other values). Since the first control signal GCH1 is a low-level voltage, the sixth transistor T6 and the eighth transistor T8 are turned off; the second control signal GCH2 is a high-level voltage, and the ninth transistor T9 and the eleventh transistor T11 are turned on. Since the ninth transistor T9 connects the first power terminal (providing the first power voltage VGL) with the first pull-down node PD1, the first pull-down node PD1 has a low-level voltage within the display time of the other frame.

Within the display time of one frame, for example, the display time of the one frame includes the first stage t1, the second stage t2, the third stage t3, and the fourth stage t4.

For example, at the first stage t1, the first clock signal CK1 is at a high voltage level, the second clock signal CK2 is at a low voltage level, the third clock signal CK3 is at a low voltage level, the fourth clock signal CK4 is at a low voltage level, the input signal INPUT is at a high voltage level, and the reset signal RESET is at a low voltage level. Since the input signal INPUT is at a high voltage level, the first transistor T1 is turned on, and the first clock signal CK1 is written into the pull-up node PU, so that the pull-up node PU has a first high-level voltage (approximately equal to the high-level voltage of the first clock signal CK1), that is to say, the input circuit 105 is configured to write the first clock signal CK1 into the pull-up node PU when the input circuit 105 is turned on (to write the first clock signal CK1 into the pull-up node PU when the first transistor T1 is turned on). Since the pull-up node PU has the first high-level voltage, the seventh transistor T7 and the tenth transistor T10 are turned on, the seventh transistor T7 writes the first power voltage VGL into the first pull-down node PD1; and the tenth transistor T10 writes the first power voltage VGL into the second pull-down node PD2. At the first stage t1, the first capacitor C1 is charged.

For example, at the second stage t2, the first clock signal CK1 is at a low voltage level, the second clock signal CK2 is at a high voltage level, the third clock signal CK3 is at a low voltage level, the fourth clock signal CK4 is at a low voltage level, the input signal INPUT is at a low voltage level, and the reset signal RESET is at a low voltage level. Due to a bootstrap effect of the first capacitor C1, the voltage of the pull-up node PU is further raised to a second high-level voltage (approximately equal to a sum of the first high-level voltage and the high-level voltage of the second clock signal CK2), the second transistor T2 is turned on to write the high-level voltage of the second clock signal CK2 into the output terminal OUTPUT, and that is to say, the output circuit 110 is configured to write the second clock signal CK2 into the output terminal OUTPUT.

For example, at the third stage t3, the first clock signal CK1 is at a low voltage level, the second clock signal CK2 is at a low voltage level, the third clock signal CK3 is at a high voltage level, the fourth clock signal CK4 is at a low voltage level, the input signal INPUT is at a low voltage level, and the reset signal RESET is at a high voltage level. The third transistor T3 is turned on, to write the high-level voltage of the third clock signal CK3 into the pull-up node PU. That is to say, the reset circuit 120 is configured to write the third clock signal CK3 into the pull-up node PU. At this point, the voltage of the pull-up node PU is, for example, the same as the first high-level voltage (approximately equal to the high-level voltage of the first clock signal CK1), and the output terminal OUTPUT is lowered to the low-level voltage.

For example, at the fourth stage t4, the first clock signal CK1 is at a low voltage level, the second clock signal CK2 is at a low voltage level, the third clock signal CK3 is at a low voltage level, the fourth clock signal CK4 is at a high voltage level, the input signal INPUT is at a low voltage level, and the reset signal RESET is at a low voltage level. The eighth transistor T8 writes the fourth clock signal CK4 into the first pull-down node PD1, and the second capacitor C2 is charged. Since the first pull-down node PD1 is at a high voltage level, the fifth transistor T5 is turned on, and the fifth transistor T5 writes the first power voltage VGL into the pull-up node PU; the twelfth transistor T12 is turned on, and the twelfth transistor T12 writes the first power voltage VGL into the output terminal OUTPUT.

In this frame, since the first control signal GCH1 is a high-level voltage, the first control circuit 140 may control the first pull-down node PD1 to operate; while the second control signal GCH2 is a low-level voltage, and the second control circuit 150 may control the second pull-down node PD2 not to operate. In this way, it is possible to make the transistor T5 in the pull-up-node pull-down circuit 130 to operate and the transistor T4 not to operate, and make the transistor T12 in the output pull-down circuit 160 to operate and the transistor T13 not to operate. Thus, possibility that the transistors are in an on state for a long time to cause malfunction is reduced, anti-interference capability of the shift register is improved, and further reliability of the shift register is improved. In the display time of the other frame, for example, the display time of the other frame includes a fifth stage t5, a sixth stage t6, a seventh stage t7 and an eighth stage t8.

For example, at the fifth stage t5, the first clock signal CK1 is at a high voltage level, the second clock signal CK2 is at a low voltage level, the third clock signal CK3 is at a low voltage level, the fourth clock signal CK4 is at a low voltage level, the input signal INPUT is at a high voltage level, and the reset signal RESET is at a low voltage level. The first transistor T1 is turned on, to write the first clock signal CK1 into the pull-up node PU, so that the pull-up node PU has the first high-level voltage (approximately equal to the high-level voltage of the first clock signal CK1), and that is to say, the input circuit 105 is configured to write the first clock signal CK1 into the pull-up node PU. Since the pull-up node PU has the first high-level voltage, the seventh transistor T7 and the tenth transistor T10 are turned on, the seventh transistor T7 writes the first power voltage VGL into the first pull-down node PD1, and the tenth transistor T10 writes the first power voltage VGL into the second pull-down node PD2. At the fifth stage t5, the first capacitor C1 is charged.

For example, at the sixth stage t6, the first clock signal CK1 is at a low voltage level, the second clock signal CK2 is at a high voltage level, the third clock signal CK3 is at a low voltage level, the fourth clock signal CK4 is at a low voltage level, the input signal INPUT is at a low voltage level, and the reset signal RESET is at a low voltage level. Due to a bootstrap effect of the first capacitor C1, the voltage of the pull-up node PU is further raised to the second high-level voltage (approximately equal to the sum of the first high-level voltage and the high-level voltage of the second clock signal CK2), the second transistor T2 is turned on to write the high-level voltage of the second clock signal CK2 into the output terminal OUTPUT, and that is to say, the output circuit 110 is configured to write the second clock signal CK2 into the output terminal OUTPUT.

For example, at the seventh stage t7, the first clock signal CK1 is at a low voltage level, the second clock signal CK2 is at a low voltage level, the third clock signal CK3 is at a high voltage level, the fourth clock signal CK4 is at a low voltage level, the input signal INPUT is at a low voltage level, and the reset signal RESET is at a high voltage level. The third transistor T3 is turned on, to write the high-level voltage of the third clock signal CK3 into the pull-up node PU. That is to say, the reset circuit 120 is configured to write the third clock signal CK3 into the pull-up node PU. At this point, the voltage of the pull-up node PU is, for example, the same as the first high-level voltage (approximately equal to the high-level voltage of the first clock signal CK1), and the output terminal OUTPUT is lowered to the low-level voltage.

For example, at the eighth stage t8, the first clock signal CK1 is at a low voltage level, the second clock signal CK2 is at a low voltage level, the third clock signal CK3 is at a low voltage level, the fourth clock signal CK4 is at a high voltage level, the input signal INPUT is at a low voltage level, and the reset signal RESET is at a low voltage level. The eleventh transistor T11 writes the fourth clock signal into the second pull-down node PD2, and the third capacitor C3 is charged. Since the second pull-down node PD2 is at a high voltage level, the fourth transistor T4 is turned on, and the fourth transistor T4 writes the first power voltage VGL into the pull-up node PU; the thirteenth transistor T13 is turned on, and the thirteenth transistor T13 writes the first power voltage VGL into the output terminal OUTPUT.

In the other frame, since the first control signal GCH1 is a low-level voltage, the first control circuit 140 may control the first pull-down node PD1 not to operate; while the second control signal GCH2 is a high-level voltage, and the second control circuit 150 may control the second pull-down node PD2 to operate. In this way, it is possible to make the transistor T5 in the pull-up-node pull-down circuit 130 not to operate and the transistor T4 to operate, and make the transistor T12 in the output pull-down circuit 160 not to operate and the transistor T13 to operate. Thus, possibility that the transistors are in an on state for a long time which may cause malfunction is reduced, anti-interference capability of the shift register is improved, and further reliability of the shift register is improved.

For example, in the shift register 100 provided by an embodiment of the present disclosure, in different frames, the first control circuit 140 and the second control circuit 150 may control the first pull-down node PD1 and the second pull-down node PD2 to operate respectively. Thus, it is possible to make the two transistors T4 and T5 in the pull-up-node pull-down circuit 130 to operate in a time-sharing manner, and to make the two transistors T12 and T13 in the output pull-down circuit 160 to operate in a time-sharing manner, which greatly reduces possibility that the transistors are in an on state for a long time to cause malfunction, improves anti-interference capability of the shift register, and further improves reliability of the shift register.

For example, the fourth transistor and the fifth transistor operate alternately under control of the first control circuit and the second control circuit; and the twelfth transistor and the thirteenth transistor operate alternately under control of the first control circuit and the second control circuit.

For example, "one frame" and "the other frame" as described in the embodiments of the present disclosure may be two adjacent frames, and may also be two non-adjacent frames, which will not be limited herein. For example, driving timing of respective signals of the shift register may be an alternation of driving timing of the "one frame" and driving timing of the "other frame", and an alternation cycle may be an alternation of each frame, an alternation of every two frames, an alternation of every three frames, etc., which will not be limited herein in the present disclosure. For example, with respect to N consecutive frames (F(1) to F(N)): when alternation is performed on each frame, driving timing of an odd frame is the driving timing of the "one frame", and driving timing of an even frame is the driving timing of the "other frame". When alternation is performed on every two frames, driving timing of each of an F(2n−1) frame and an F(2n) frame is the driving timing of the "one frame", and driving timing of each of an F(2n+1) frame and an F(2n+2) frame is the driving timing of the "other frame", where n is an integer greater than 0. When alternation is performed on every three frames, driving timing of each of an F(3n−2) frame, an F(3n−1) frame, and an F(3n) frame is the driving timing of the "one frame", and driving timing of each of an F(3n+1) frame, an F(3n+2) frame and an F(3n+3) frame is the driving timing of the "other frame", where n is an integer greater than 0.

For example, when the shift register works normally, the discharging signal EN is at a low voltage level, and the fourteenth transistor T14, the fifteenth transistor T15 and the sixteenth transistor T16 are turned off; and at this point, the discharging circuit 180 has no impact on the shift register. When an abnormal power-down occurs in the circuit, the discharging signal EN changes to a high voltage level, the fourteenth transistor T14, the fifteenth transistor T15 and the sixteenth transistor T16 are turned on, and the discharging signal EN sets the output terminal OUTPUT to a high voltage level through the fourteenth transistor T14, so that a pixel circuit controlled by a signal of the output terminal OUTPUT of the shift register is turned on to provide a discharging channel, and damage of the shift register, the gate driving circuit or the display panel is prevented when abnormal power-down occurs; the fifteenth transistor T15 writes the first power voltage VGL into the second pull-down node PD2 to set the second pull-down node PD2 to a low-level voltage, so as to prevent charge accumulation on the second pull-down node PD2 from damaging the circuit; and the sixteenth transistor T16 writes the first power voltage VGL into the first pull-down node PD1 to set the first pull-down node PD1 to a low-level voltage, so as to prevent charge accumulation on the first pull-down node PD1 from damaging the circuit.

Figure 6:
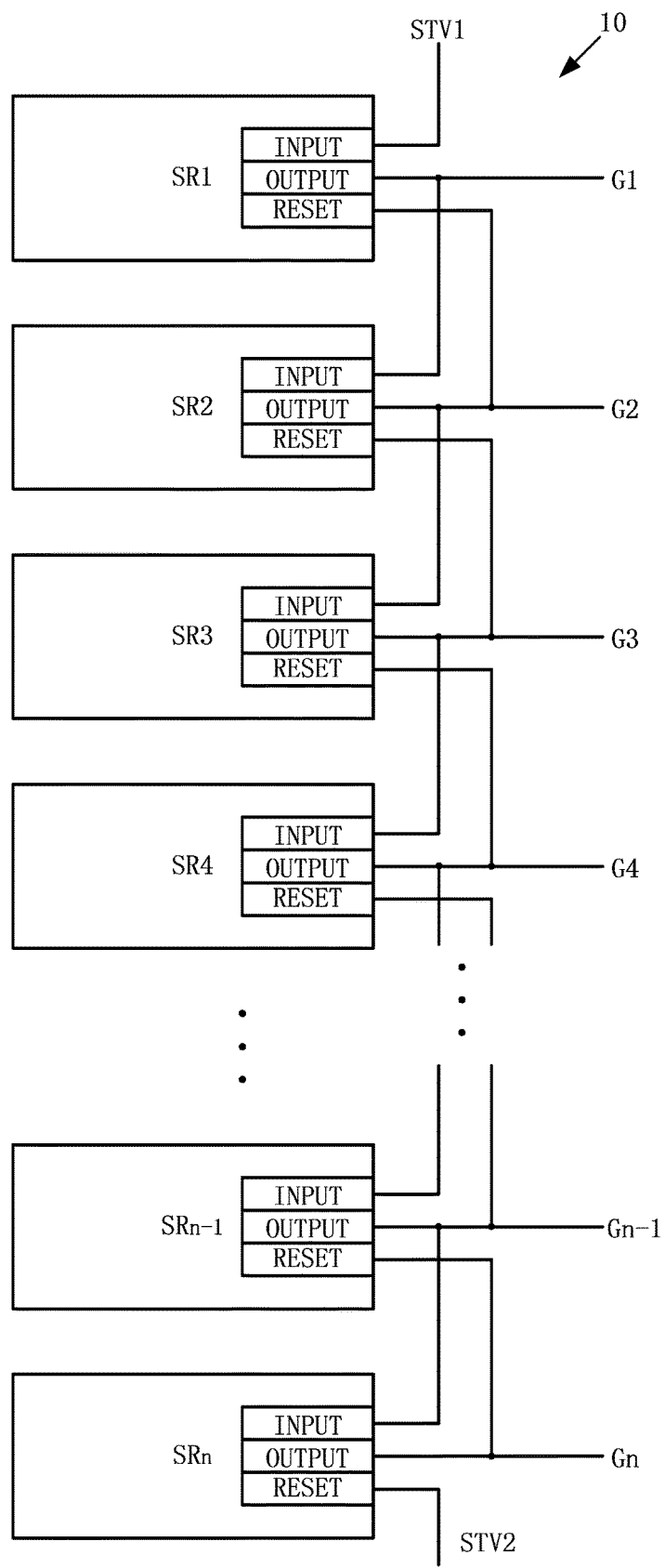
FIG. 6 is a schematic diagram of a gate driving circuit provided by an embodiment of the present disclosure.

An embodiment of the present disclosure further provides a gate driving circuit 10; as shown in FIG. 6, the gate driving circuit 10 comprises a shift register 100 provided by any one embodiment of the present disclosure.

For example, with reference to FIG. 6, the gate driving circuit 10 provided by an embodiment of the present disclosure comprises a plurality of cascaded shift registers 100 provided by any one embodiment of the present disclosure; except a shift register 100 at a first stage and a shift register 100 at a last stage, an input terminal (for receiving the input signal INPUT) of a shift register 100 at a present stage is connected with an output terminal OUTPUT of a shift register 100 at a previous stage; a reset signal terminal (for receiving a reset signal RESET) of the shift register 100 at the present stage is connected with an output terminal OUTPUT of a shift register 100 at a next stage.

For example, an input terminal of the shift register at the first stage is connected with a first trigger-signal terminal to receive a first trigger signal STV1; and a reset signal terminal of the shift register at the last stage is connected with a second trigger-signal terminal to receive a second trigger signal STV2.

For example, when the gate driving circuit 10 scans forwardly, the first trigger signal STV1 functions as an input signal of the shift register at the first stage, and the second trigger signal STV2 functions as a reset signal of the shift register at the last stage; when the gate driving circuit 10 scans backwardly, the second trigger signal STV2 functions as an input signal of the shift register at the last stage, and the first trigger signal STV1 functions as a reset signal of the shift register at the first stage. For example, during backward scanning, functions of the input circuit and the reset circuit of the shift register are interchanged.

For example, as shown in FIG. 6, the gate driving circuit 10 comprises n stages of shift registers SR1, SR2, . . . , SRn, and all of the shift registers SR1, SR2, . . . , SRn may be the shift registers 100 provided by any one embodiment of the present disclosure. The output terminals OUTPUT of the shift registers SR1, SR2, . . . , SRn are respectively connected with gate lines G1, G2, . . . , Gn correspondingly.

It should be noted that, since the gate driving circuit 10 provided by an embodiment of the present disclosure may implement forward scanning and backward scanning, when a scan direction is switched, the "previous stage" and the "next stage" in terms of timing may change correspondingly; and therefore, the "previous stage" and the "next stage" as described above does not refer to the previous stage and the next stage in terms of scan timing, but refer to the previous stage and the next stage in terms of physical connection.

Figure 7:
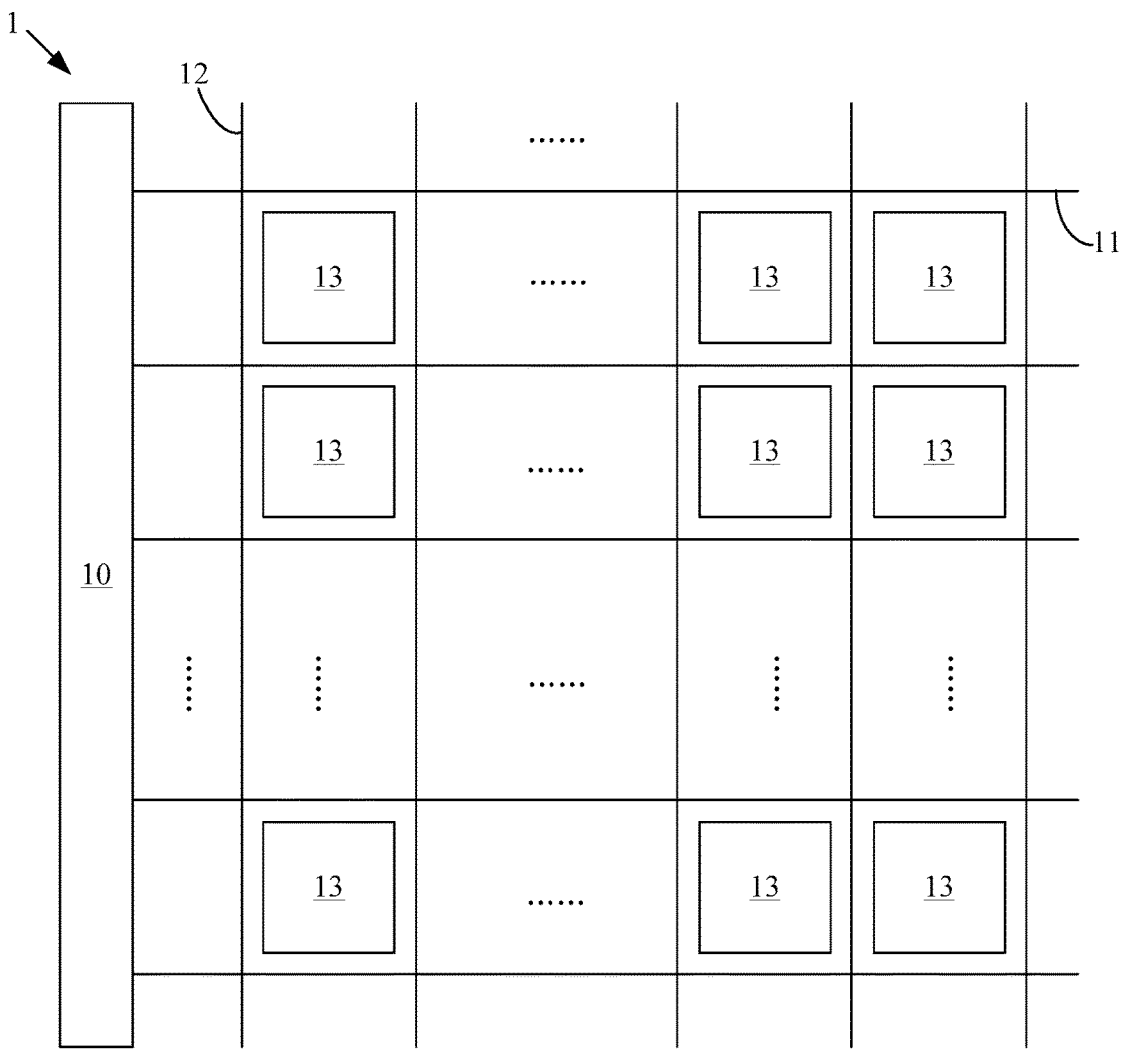
FIG. 7 is a schematic diagram of a display panel provided by an embodiment of the present disclosure.

An embodiment of the present disclosure further provides a display panel 1, as shown in FIG. 7, and the display panel 1 comprises a gate driving circuit 10 provided by any one embodiment of the present disclosure.

For example, as shown in FIG. 7, the display panel 1 provided by an embodiment of the present disclosure further comprises gate lines 11, data lines 12, and a plurality of pixel units 13 defined by the gate lines 11 and the data lines 12 intersecting with each other; and the gate driving circuit 10 is configured to provide gate driving signals to the gate lines 11.

For example, the gate lines 11 may include gate lines G1, G2, . . . , Gn as shown in FIG. 6, and a shift register of each stage in the shift registers SR1, SR2, . . . , SRn is used for outputting a gate driving signal to a corresponding gate line G1, G2, . . . , Gn.

Figure 8:
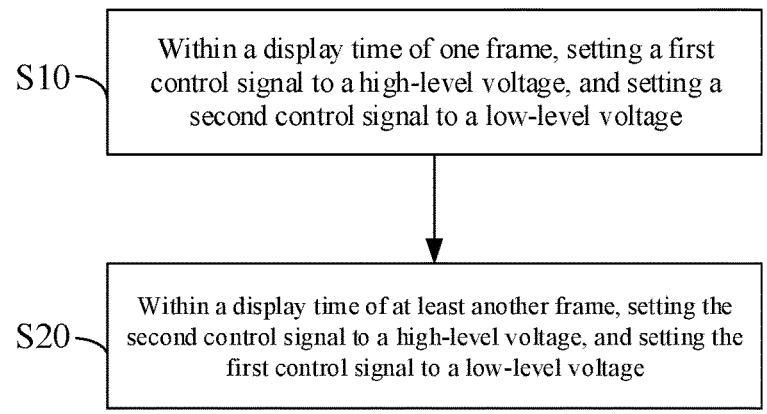
FIG. 8 is a flow chart of a driving method of a shift register provided by an embodiment of the present disclosure.

An embodiment of the present disclosure further provides a driving method of a shift register 100 provided by any embodiment of the present disclosure; and as shown in FIG. 8, the method comprises steps of:

Step S10: within a display time of one frame, setting a first control signal GCH1 to a high-level voltage, and setting a second control signal GCH2 to a low-level voltage, where: when the first control signal is a high-level voltage, a fourth clock signal is written into a first pull-down node, a first power voltage is written into a second pull-down node; and the first power voltage is written into the first pull-down node in response to a voltage of a pull-up node being a high-level voltage;

Step S20: within a display time of at least another frame, setting the second control signal GCH2 to a high-level voltage, and setting the first control signal GCH1 to a low-level voltage, where: when the second control signal is a high-level voltage, the fourth clock signal is written into the second pull-down node, the first power voltage is written into the first pull-down node; and the first power voltage is written into the second pull-down node in response to the voltage of the pull-up node being a high-level voltage.

For example, within a display time of each frame, the first control signal GCH1 and the second control signal GCH2 are both set as reverse signals relative to corresponding signals within a display time of a previous frame. That is to say, both the first control signal GCH1 and the second control signal GCH2 of each frame are signals reverse to the first control signal GCH1 and the second control signal GCH2 in the previous frame, respectively. For example, in the previous frame, the first control signal GCH1 is a high-level voltage (for example, 5V) and the second control signal GCH2 is a low-level voltage (for example, 0V), then, in the current frame, the first control signal GCH1 is a low-level voltage (for example, 0V), and the second control signal GCH2 is a high-level voltage (for example, 5V).

For example, it is possible to flexibly select to switch the first control signal GCH1 and the second control signal GCH2 once every several frames, according to specific conditions of the circuit.

For example, the shift register, the gate driving circuit, the display panel and the driving method provided by the embodiments of the present disclosure may enable the first control circuit and the second control circuit to work in a time-sharing manner, which reduces a risk that the transistors are in an on state for a long time, improves anti-interference capability, and improves reliability of the gate driving circuit and the display panel.

For example, the shift register, the gate driving circuit, the display panel and the driving method provided by the embodiments of the present disclosure may be applied in an in-vehicle display system.

Although embodiments of the disclosure have been described above in details with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The disclosure claims the priority of the Chinese Patent Application No. 201710099908.6 filed on Feb. 23, 2017, which is incorporated herein by reference in its entirety as part of the disclosure of the present application.

The invention claimed is:

1. A shift register, comprising:
   an input circuit, connected with a pull-up node, and configured to write a first clock signal into the pull-up node;
   an output circuit, connected with the pull-up node and an output terminal respectively, and configured to write a second clock signal into the output terminal;
   a pull-up-node pull-down circuit, connected with the pull-up node, a first pull-down node, a second pull-down node and a first power terminal respectively;
   a first control circuit, configured to write a fourth clock signal into the first pull-down node and write a first power voltage into the second pull-down node in response to a first control signal, and to write the first power voltage into the first pull-down node in response to a voltage of the pull-up node;

a second control circuit, configured to write the fourth clock signal into the second pull-down node and write the first power voltage into the first pull-down node in response to a second control signal, and to write the first power voltage into the second pull-down node in response to the voltage of the pull-up node; and an output pull-down circuit, connected with the output terminal, the first pull-down node, the second pull-down node, and the first power terminal respectively;

wherein the first control signal and the second control signal are mutually reverse signals.

2. The shift register according to claim 1, further comprising a reset circuit, connected with the pull-up node, and configured to write a third clock signal into the pull-up node; wherein:

the input circuit includes a first transistor, a first electrode of the first transistor is connected with a first clock signal terminal to receive the first clock signal, a gate electrode of the first transistor is connected with the input terminal to receive an input signal, and a second electrode of the first transistor is connected with the pull-up node;

the output circuit includes a second transistor, a first electrode of the second transistor is connected with a second clock signal terminal to receive the second clock signal, a gate electrode of the second transistor is connected with the pull-up node, and a second electrode of the second transistor is connected with the output terminal;

the reset circuit includes a third transistor, a first electrode of the third transistor is connected with a third clock signal terminal to receive the third clock signal, a gate electrode of the third transistor is connected with a reset signal terminal to receive a reset signal, and a second electrode of the third transistor is connected with the pull-up node.

3. The shift register according to claim 1, wherein the pull-up-node pull-down circuit includes a fourth transistor and a fifth transistor;

a first electrode of the fourth transistor is connected with the pull-up node, a gate electrode of the fourth transistor is connected with the second pull-down node, and a second electrode of the fourth transistor is connected with the first power terminal to receive the first power voltage;

a first electrode of the fifth transistor is connected with the pull-up node, a gate electrode of the fifth transistor is connected with the first pull-down node, and a second electrode of the fifth transistor is connected with the first power terminal to receive the first power voltage.

4. The shift register according to claim 3, wherein the fourth transistor and the fifth transistor operate alternately under control of the first control circuit and the second control circuit.

5. The shift register according to claim 1, wherein:

the first control circuit includes a sixth transistor, a seventh transistor and an eighth transistor;

a first electrode of the sixth transistor is connected with the second pull-down node, a gate electrode of the sixth transistor is connected with the first control-signal terminal to receive the first control signal, a second electrode of the sixth transistor is connected with the first power terminal to receive the first power voltage;

a first electrode of the seventh transistor is connected with the first pull-down node, a gate electrode of the seventh transistor is connected with the pull-up node, and a second electrode of the seventh transistor is connected with the first power terminal to receive the first power voltage;

a first electrode of the eighth transistor is configured to receive the fourth clock signal, a gate electrode of the eighth transistor is connected with the first control-signal terminal to receive the first control signal, and a second electrode of the eighth transistor is connected with the first pull-down node;

the second control circuit includes a ninth transistor, a tenth transistor and an eleventh transistor;

a first electrode of the ninth transistor is connected with the first pull-down node, a gate electrode of the ninth transistor is connected with the second control-signal terminal to receive the second control signal, and a second electrode of the ninth transistor is connected with the first power terminal to receive the first power voltage;

a first electrode of the tenth transistor is connected with the second pull-down node, a gate electrode of the tenth transistor is connected with the pull-up node, and a second electrode of the tenth transistor is connected with the first power terminal to receive the first power voltage;

a first electrode of the eleventh transistor is configured to receive the fourth clock signal, a gate electrode of the eleventh transistor is connected with the second control-signal terminal to receive the second control signal, and a second electrode of the eleventh transistor is connected with the second pull-down node.

6. The shift register according to claim 1, wherein the output pull-down circuit includes a twelfth transistor and a thirteenth transistor;

a first electrode of the twelfth transistor is connected with the output terminal, a gate electrode of the twelfth transistor is connected with the first pull-down node, and a second electrode of the twelfth transistor is connected with the first power terminal to receive the first power voltage;

a first electrode of the thirteenth transistor is connected with the output terminal, a gate electrode of the thirteenth transistor is connected with the second pull-down node, and a second electrode of the thirteenth transistor is connected with the first power terminal to receive the first power voltage.

7. The shift register according to claim 6, wherein the twelfth transistor and the thirteenth transistor operate alternately under control of the first control circuit and the second control circuit.

8. The shift register according to claim 1, further comprising a first storage circuit, connected with the pull-up node and the output terminal respectively, wherein the first storage circuit includes a first capacitor, a first terminal of the first capacitor is connected with the pull-up node, and a second terminal of the first capacitor is connected with the output terminal.

9. The shift register according to claim 1, further comprising a discharging circuit, connected with a discharging signal terminal, the output terminal, the first pull-down node, the second pull-down node and the first power terminal respectively, and is configured to, when an abnormal power-down occurs, write the discharging signal into the output terminal, and write the first power voltage into the first pull-down node and the second pull-down node respectively.

10. The shift register according to claim 9, wherein the discharging circuit includes a fourteenth transistor, a fifteenth transistor and a sixteenth transistor;
   a first electrode of the fourteenth transistor is connected with the discharging signal terminal to receive the discharging signal, a gate electrode of the fourteenth transistor is connected with the discharging signal terminal to receive the discharging signal, and a second electrode of the fourteenth transistor is connected with the output terminal;
   a first electrode of the fifteenth transistor is connected with the second pull-down node, a gate electrode of the fifteenth transistor is connected with the discharging signal terminal to receive the discharging signal, and a second electrode of the fifteenth transistor is connected with the first power terminal;
   a first electrode of the sixteenth transistor is connected with the first pull-down node, a gate electrode of the sixteenth transistor is connected with the discharging signal terminal to receive the discharging signal, and a second electrode of the sixteenth transistor is connected with the first power terminal.

11. The shift register according to claim 1, further comprising a second storage circuit and a third storage circuit, wherein:
   the second storage circuit is connected with the first pull-down node and the first power terminal respectively, and is configured to maintain a voltage difference between the first pull-down node and the first power terminal;
   the third storage circuit is connected with the second pull-down node and the first power terminal respectively, and is configured to maintain a voltage difference between the second pull-down node and the first power terminal.

12. The shift register according to claim 11, wherein:
   the second storage circuit includes a second capacitor, a first terminal of the second capacitor is connected with the first pull-down node, and a second terminal of the second capacitor is connected with the first power terminal;
   the third storage circuit includes a third capacitor, a first terminal of the third capacitor is connected with the second pull-down node, and a second terminal of the third capacitor is connected with the first power terminal.

13. The shift register according to claim 1, further comprising a seventeenth transistor, wherein the first control circuit and the second control circuit receive the fourth clock signal through the seventeenth transistor, a first electrode of the seventeenth transistor is connected with the fourth clock signal terminal, a gate electrode of the seventeenth transistor is connected with the fourth clock signal terminal, and a second electrode of the seventeenth transistor is connected with the first control circuit and the second control circuit.

14. A gate driving circuit, comprising the shift register according to claim 1.

15. The gate driving circuit according to claim 14, comprising a plurality of cascaded shift registers, wherein except a shift register at a first stage and a shift register at a last stage, an input terminal of a shift register at a present stage is connected with an output terminal of a shift register at a previous stage; and a reset signal terminal of the shift register at a present stage is connected with an output terminal of a shift register at a next stage.

16. A display panel, comprising the gate driving circuit according to claim 14.

17. A driving method of the shift register according to claim 1, comprising:
   within a display time of one frame, setting a first control signal to a high-level voltage, and setting a second control signal to a low-level voltage, wherein when the first control signal is the high-level voltage, a fourth clock signal is written into a first pull-down node, a first power voltage is written into a second pull-down node, and in response to a voltage of a pull-up node being the high-level voltage, the first power voltage is written into the first pull-down node;
   within a display time of at least another frame, setting the second control signal to the high-level voltage, and setting the first control signal to the low-level voltage, wherein when the second control signal is the high-level voltage, the fourth clock signal is written into the second pull-down node, the first power voltage is written into the first pull-down node, and in response to the voltage of the pull-up node being the high-level voltage, the first power voltage is written into the second pull-down node.

18. The shift register according to claim 2, further comprising a discharging circuit, connected with a discharging signal terminal, the output terminal, the first pull-down node, the second pull-down node and the first power terminal respectively, and is configured to, when an abnormal power-down occurs, write the discharging signal into the output terminal, and write the first power voltage into the first pull-down node and the second pull-down node respectively.

19. The shift register according to claim 2, further comprising a second storage circuit and a third storage circuit, wherein:
   the second storage circuit is connected with the first pull-down node and the first power terminal respectively, and is configured to maintain a voltage difference between the first pull-down node and the first power terminal;
   the third storage circuit is connected with the second pull-down node and the first power terminal respectively, and is configured to maintain a voltage difference between the second pull-down node and the first power terminal.

20. The shift register according to claim 2, further comprising a seventeenth transistor, wherein the first control circuit and the second control circuit receive the fourth clock signal through the seventeenth transistor, a first electrode of the seventeenth transistor is connected with the fourth clock signal terminal, a gate electrode of the seventeenth transistor is connected with the fourth clock signal terminal, and a second electrode of the seventeenth transistor is connected with the first control circuit and the second control circuit.

\* \* \* \* \*